US010332595B2

(12) United States Patent
Jeon

(10) Patent No.: US 10,332,595 B2
(45) Date of Patent: Jun. 25, 2019

(54) DETERMINING RESISTANCE STATES OF MEMRISTORS IN A CROSSBAR ARRAY

(71) Applicant: Hewlett Packard Enterprise Development LP, Houston, TX (US)

(72) Inventor: Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,051

(22) PCT Filed: Feb. 24, 2015

(86) PCT No.: PCT/US2015/017367
§ 371 (c)(1),
(2) Date: Jan. 28, 2017

(87) PCT Pub. No.: WO2016/137449
PCT Pub. Date: Sep. 1, 2016

(65) Prior Publication Data
US 2017/0271003 A1 Sep. 21, 2017

(51) Int. Cl.
*G11C 13/00* (2006.01)
(52) U.S. Cl.
CPC ........ *G11C 13/004* (2013.01); *G11C 13/0033* (2013.01); *G11C 2013/0054* (2013.01); *G11C 2013/0057* (2013.01); *G11C 2213/72* (2013.01)
(58) Field of Classification Search
CPC .................. G11C 13/004; G11C 2013/0054
See application file for complete search history.

(56) References Cited

U.S. PATENT DOCUMENTS

| 8,310,858 | B2 | 11/2012 | Ito |
| 2005/0169038 | A1* | 8/2005 | Inoue ........................ G11C 7/06 365/148 |
| 2008/0144357 | A1 | 6/2008 | Siau et al. |
| 2010/0073990 | A1* | 3/2010 | Siau .................... G11C 11/5685 365/148 |
| 2013/0148406 | A1 | 6/2013 | Shimakawa et al. |
| 2013/0322156 | A1 | 12/2013 | Papandreou et al. |

(Continued)

FOREIGN PATENT DOCUMENTS

WO WO-2011119158 9/2011
WO WO-2014018063 A1 1/2014

OTHER PUBLICATIONS

International Searching Authority, The Internatonal Search Report and the Written Opinion, PCT/US2015/017367, dated Nov. 25, 2015, 12 Pgs.

(Continued)

*Primary Examiner* — Jerome Leboeuf
(74) *Attorney, Agent, or Firm* — Hewlett Packard Enterprise Patent Department

(57) ABSTRACT

The resistance state of a memristor in a crossbar array is determined. For instance, a combined reference-sneak current is determined based on a reference voltage, a sense voltage, a non-access voltage, and a voltage applied to a target row line, and a combined read-sneak current is determined based on a read voltage, a sense voltage, a non-access voltage, and a voltage applied to a reference row line. The resistance state of a target memristor is then determined based on the combined reference-sneak current and the combined read-sneak current.

13 Claims, 6 Drawing Sheets

(56) References Cited

U.S. PATENT DOCUMENTS

| | | |
|---|---|---|
| 2014/0112054 A1 | 4/2014 | Shimakawa et al. |
| 2014/0112056 A1* | 4/2014 | Tsuji .................. G11C 8/08 |
| | | 365/148 |
| 2014/0133211 A1 | 5/2014 | Nazarian et al. |
| 2014/0151626 A1 | 6/2014 | Phatak |
| 2014/0183439 A1 | 7/2014 | Hashim et al. |
| 2014/0306173 A1 | 10/2014 | Huang et al. |
| 2015/0171868 A1* | 6/2015 | Rodriguez ............ H03K 19/08 |
| | | 326/38 |

OTHER PUBLICATIONS

Zidan, M.A., et al., Memristor Multi-Port Readout: A Closed-Form Solution for Sneak-Paths, Feb. 10, 2014, IEEE Transactions on Nanotechnology, 9 pages.

\* cited by examiner

DETERMINING RESISTANCE STATES OF
MEMRISTORS IN A CROSSBAR ARRAY

BACKGROUND

Memory arrays are used to store data. A memory array may be made up of a number of memory elements. Data may be stored to memory elements by assigning logic values to the memory elements within the memory arrays. For example, the memory elements may be set to 0, 1, or combinations thereof to store data in a memory element of a memory array. Much time and effort has been expended in designing and implementing nanoscale memory arrays. In some examples the nanoscale memory arrays may be arranged in a crossbar array where a first number of conducting lines intersect a second number of conducting lines to form a grid where memory elements are placed at each intersection.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
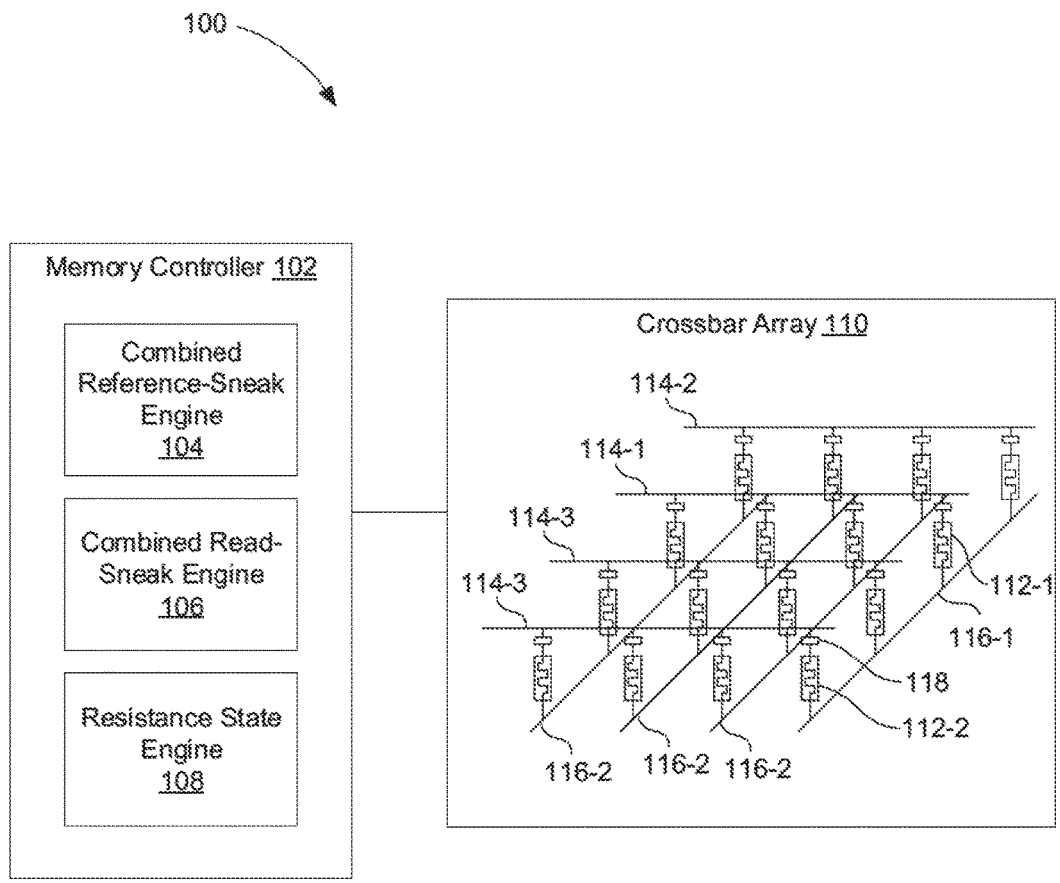
FIG. 1 is a diagram of a system for determining a resistance state of a memristor in a crossbar array, according to one example of the principles described herein.

Crossbar arrays are one example of memory arrays. Crossbar arrays of memory elements, such as memristors, may be used in a variety of applications, including non-volatile solid state memory, programmable logic, signal processing, control systems, pattern recognition, and other applications. A crossbar array includes a first set of conducting lines that intersect a second set of conducting lines, in an approximately orthogonal orientation for example. For simplicity, in the present specification the first set of conducting lines may be referred to as row lines and the second set of conducting lines may be referred to as column lines. A memory cell may be placed at intersections, such as at each intersection, of row lines and column lines. A memory cell may include a memory element such as a memristor to store information and a selector to regulate current flow through the memory element. In this example, a number of memristors may share a particular row line and another number of memristors may share a particular column line.

Each memory element can represent at least two logic values, for example a 1 and a 0. Memory elements such as memristors may use resistance levels to indicate a particular logic value. In using a memristor as an element in a memory array, a digital operation is emulated by applying an activation energy, such as voltage pulses of different values or polarities, to place the memristor in a "low resistance state" which resistance state is associated with a logical value, such as "1." Similarly, a voltage pulse of a different polarity, or different value, may place the memristor in a "high resistance state," which resistance state is associated with another logical value, such as "0." Each memristor has a switching voltage which refers to a voltage potential across a memristor which effectuates a change in the resistance state of the memristor. For example, a switching voltage of a memristor may be between 1-2 volts (V). In this example, a voltage potential across the memristor that is greater than the switching voltage (I.e., the 1-2 V) causes the memristor to change between resistance states. While specific reference is made to a voltage pulse, the activation energy to change the state of the memristor may also be provided by a current source.

To determine what resistance state, and corresponding logic value, is indicated by a memristor, a current is driven through a target memristor by applying a voltage to a row line and column line corresponding to the target memristor. Using the applied voltages and the resistance of the target memristor, a current is collected along a column line and is used to determine the resistance state of the memristor. However, while crossbar memory arrays may offer high density storage, certain characteristics may affect their usefulness in storing information.

For example, to determine a resistance state of a memristor, a current is collected along a target column line corresponding to the target memristor. This output current is then compared to a reference current to ascertain the resistance state of the memristor. If the output current is greater than the reference current then the memristor may be determined to be in a low resistance state. By comparison, if the output current is smaller than the reference current, then the memristor may be determined to be in a high resistance state. In these systems, a reference current is used, which includes additional circuitry. The additional circuitry may introduce latency into the determination of a resistance state.

Additionally, in this example, a sneak current may be 1) determined and then 2) subtracted to determine an output current, which output current is compared 3) to a reference current. In other words, there may be many sensing periods executed in order to compare the output current to a reference current.

Moreover, in applying a portion of an applied voltage to a target row line and another portion of the applied voltage to a target column line, other memristors that fall along these target lines may also see a voltage drop, albeit a voltage drop smaller than the voltage drop across the target memristor. The voltage potential across these partially-selected memristors generates a current path in the crossbar array. These additional current paths are referred to as sneak currents and are undesirable as they are noise to the intended target output current. Large sneak currents may lead to a number of issues such as saturating the current of driving transistors and increasing power consumption. Moreover, large sneak currents may introduce large amounts of noise which may lead to inaccurate or ineffective memory reading and writing operations.

In some examples, a selector may be placed serially in front of a memristor. The selector may have a threshold voltage. An applied voltage less than the threshold voltage does not pass through to the corresponding memristor and accordingly a portion of a sneak current may be reduced. However, even while an applied voltage may be less than the threshold voltage of the selector, a small amount of current may still flow through the memory cell.

The systems and methods described herein may alleviate these and other complications. More specifically, the present systems and methods describe determining a combined reference-sneak current and storing the combined reference-sneak current during a first stage. During a second stage, a combined read-sneak current is determined. A resistance state is determined by comparing the combined reference-sneak current to the combined read-sneak current.

In this example, the crossbar array may include reference rows that include memristors having similar characteristics as other memristors in the crossbar array. As will be described below, the reference rows may be used to generate a reference current, from which a resistance of a target memristor is determined. As the memristors in the reference row have similar characteristics as the other memristors, and experience the same variations as the other memristors in the crossbar array, an accurate reference current may be determined without additional circuitry and sensing time.

The present disclosure describes a method for determining a resistance state of a memristor in a crossbar array. In the method, a combined reference-sneak current is determined based on a reference voltage, a sense voltage, a non-access voltage, and a voltage applied to a target row line. Also in the method, a combined read-sneak current is determined based on a read voltage, the sense voltage, the non-access voltage, and a voltage applied to the reference row line. A resistance state of a target memristor is determined based on the combined reference-sneak current and the combined read-sneak current.

A system for determining a resistance state of a memristor in a crossbar array is described. The system includes a crossbar array of memristors. The crossbar array includes a number of row lines and a number of column lines intersecting the row lines. A memristor is located at a number of the intersections between row lines and column lines. The system also includes a memory controller. The memory controller includes a combined reference-sneak engine to determine a combined reference-sneak current based on an applied reference voltage, an applied sense voltage, an applied non-access voltage, and a voltage applied to a target row line. The system also includes a combined read-sneak engine to determine a combined read-sneak current based on an applied access voltage, the applied sense voltage, the applied non-access voltage, and a voltage applied to the reference row line. The system also includes a resistance state engine to determine the resistance state of the memristor based on a difference between the combined reference-sneak current and the combined read-sneak current.

A non-transitory machine-readable storage medium encoded with instructions executable by a processor is described. The machine-readable storage medium includes instructions to apply a reference voltage to a reference row line of a crossbar array, apply a non-access voltage to non-target non-reference row lines and non-target column lines of the crossbar array, apply a sense voltage to a target column line of the crossbar array, apply a read voltage to a target row line of the crossbar array, and determine a resistance state of a target memristor based on the applied reference voltage, the non-access voltage, and the read voltage.

The systems and methods described herein may allow for effective determination of a resistance state of a memristor. For example, the reference row line may include memristors having similar characteristics as the rest of the memristors in the crossbar array. As they share similar characteristics, they will respond similarly to applied voltages. Accordingly, the reference row line allows for an effective reference current to be generated without much additional circuitry all while reducing sensing time. Put another way, a more accurate reference current is generated as a reference voltage is applied to reference memristors that share characteristics with other memristors in the crossbar array. In other words, the systems and methods described herein provide an accurate determination of resistance state by providing an accurate reference current to which a read current can be compared; all while maintaining simplicity of the sensing circuit.

As used in the present specification and in the appended claims, the term "memristor" may refer to a passive two-terminal circuit element that changes its electrical resistance under sufficient electrical bias. A memristor may receive an access voltage which may be a read voltage or a write voltage.

Further, as used in the present specification and in the appended claims, the term larger may refer to a memristor that is to be written to or read from. A target row line and a target column line may be row line and column line that correspond to the target memristor. Accordingly, non-target row lines and non-target column lines may be row lines and column lines that are not the target row or column line. A target memristor may refer to a memristor with a closed selector as opposed to an open selector.

Still further, as used in the present specification and in the appended claims, the term "reference" may refer to a row line or memristor that is used to generate a reference current. Accordingly, non-reference row lines may be row lines and column lines that are not the reference row line. Accordingly, a non-target non-reference row line may be a row line that is neither a target row line nor a reference row line.

Still further, as used in the present specification and in the appended claims, the term "combined" refers to a current that is the combination of multiple currents. For example a combined reference-sneak current may be a current that is a combination of a reference current and a sneak current. Similarly, a combined read-sneak current may be a current that is a combination of a read current and a sneak current.

Still further, as used in the present specification and in the appended claims, the term "partially-selected memristor" may refer to a memristor that falls along a target row line or a target column line that is not the target memristor. The partially-selected memristor may have a voltage drop that is less than a voltage drop of the target memristor.

Still further, as used in the present specification and in the appended claims, the terms "row lines" and "column lines" may refer to distinct conducting lines, such as wires, that are formed in a grid and apply voltages to the memristors in the array. A memristor may be found at the intersection of a row line and a column line. While specific use of the term row and column are used, such are for simplicity and the position of the wires may be oriented differently.

Still further, as used in the present specification and in the appended claims the term "access voltage" may refer to a voltage that is applied to a target memristor. The access voltage may be a write voltage that is larger than a switching voltage of a memristor, or may be a read voltage that is less than the switching voltage of the memristor. By comparison, a non-access voltage may refer to a voltage that is not greater than either a read voltage or a write voltage. The access voltage may be greater than a threshold voltage for a selector, the threshold voltage being a voltage sufficient to open a selector and a non-access voltage may be less than the threshold voltage for a selector.

Still further, as used in the present specification and in the appended claims, the term "sensing voltage" may refer to a voltage that is applied to a target column line of the crossbar array. The sensing voltage may be a voltage used to generate a voltage potential across a target memristor cell. The sensing voltage may cause a sufficiently detectable current difference between a high resistance and low resistance state of the memristor cell and may avoid causing the resistance state of the memristor to change.

Even further, as used in the present specification and in the appended claims, the term "reference voltage" may refer to a voltage that is applied to the reference row line of the crossbar array in determining a combined reference-sneak current. In some examples, the reference voltage may be the same as the read voltage.

Yet further, as used in the present specification and in the appended claims, the term "a number of" or similar language may include any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described is included in at least that one example, but not necessarily in other examples.

FIG. 1 is a diagram of a system (100) for determining a resistance state of a memristor (112) in a crossbar array (110), according to one example of the principles described herein. The system (100) may be implemented in an electronic device. Examples of electronic devices include servers, desktop computers, laptop computers, personal digital assistants (PDAs), mobile devices, smartphones, gaming systems, and tablets, among other electronic devices. The system (100) may be utilized in any data processing scenario including, stand-alone hardware, mobile applications, through a computing network, or combinations thereof. Further, the system (100) may be used in a computing network, a public cloud network, a private cloud network, a hybrid cloud network, other forms of networks, or combinations thereof.

The system (100) may include a crossbar array (110). The crossbar array (110) may include a number of row lines (114-1, 114-2, 114-3), a number of column lines (116-1, 116-2), a number of memristors (112-1, 112-2), and a number of selectors (118) such as non-linear selectors (118) that are connected serially with the memristors (112). Specifically, a crossbar array (110) may include a target row line (114-1), at least one reference row line (114-2) and a number of non-target non-reference row lines (114-3). The crossbar array (110) may also include a target column line (116-1) and a number of non-target column lines (116-2). A target memristor (112-1) may be distinguished between other memristors (112-2) as the target memristor (112-1) falls at the intersection of the target row line (114-1) and the target column line (116-1).

The combination of a memristor (112) and a selector (118) may be referred to as a memory cell. For simplicity, one or a few instances of each element are identified with a reference number. Even though four row lines (114) and four column lines (116) are depicted in FIG. 1, any number of row lines (114) and column lines (116) may be present in the crossbar array (110). As depicted in FIG. 1, the row lines (114) and the column lines (116) may be orthogonal to one another. The two layers of lines (114, 116) forming a crossbar, each of the row lines (114) overlaying the column lines (116) and coming into close contact with each column line (116) at intersections that represent the closest contact between each line.

The lines (114, 116) may effectuate voltage potentials across the memristors (112) by carrying current through the crossbar array (110). For example, a target row line (114-1) may supply a first voltage to the target memristor (112-1) while a target column line (116-1) applies a second voltage to the target memory element (112-1). The difference between the first voltage and second voltage generating a voltage potential across the target memristor (112-1). The voltage potential may be either a voltage less than the switching voltage of the target memristor (112-1), i.e., a read voltage; or may be greater than the switching voltage of the target memristor (112-1), i.e., a write voltage. In some examples, the voltage supplied by the target row line (114-1) may be the total voltage value and the target column line (116-1) may be grounded.

The crossbar array (110) may include a reference row line (114-2). The reference row line (114-2) may be a row line (114) of the crossbar array (110) that receives a reference voltage during a first stage. The reference row line (114-2) includes memristors (112) and selectors (118) that are the same, i.e., same manufacture, same characteristics, etc., as other memristors (112) and selectors (118) in the crossbar array (110). For example, the memristors (112) in the reference row line (114-2) and other row lines (114-3) may be nonlinear memristors (112) exhibiting nonlinear current voltage behavior.

Including reference memristors (112) that have the same characteristics as other memristors (112) in the crossbar array (110) may be beneficial as a similar sneak behavior can be determined as all memristors (112) in the crossbar array (110) may react similarly to environmental conditions such as array temperature. For example, there may be local variations in the characteristics within a wafer, or even within a chip. Wide variations of these characteristics make it difficult to find a right operating condition, i.e., a reference current that can be used with all memory cells to determine a reference state for the various cells. However, if reference memristors are placed in close vicinity to the target memristors, as described herein, the reference memristors may have responses similar to the other memristors (112) in the crossbar array (110). With reference memristors having similar characteristics, a user can easily determine the right operating condition that works for the target memristors (112-1) around them. This benefit may be most prevalent when the variation within an array is small, while the variation throughout a chip or throughout a wafer is large since the reference memristors gives customized operation conditions for the memristors around them, i.e., within the crossbar array (110).

A memristor (112) is a non-volatile memory element. A memristor (112) can be used to represent a number of bits of data. For example, a memristor (112) in a low resistance state may represent a logic value of "1." The same memristor (112) in a high resistance state may represent a logic value of "0." Each logic value is associated with a resistance state of the memristor (112) such that data can be stored in a memristor (112) by changing the resistance state of the memristor (112). This may be done by applying an access voltage to a target memristor (112-1) by passing voltages to target lines that correspond to the target memristor (112).

A memristor (112) is a specific type of memory element that can change resistances by transporting constituent elements within a switching layer to increase or decrease the resistivity of the memristor (112). As a sufficient voltage is passed across the memristor (112) the constituent elements become active such that they move within a switching layer of the memristor (112) and thereby change the resistance of the memristor (112).

A memristor (112) is non-volatile because the memristor (112) maintains its resistivity, and indicated logic value even in the absence of a supplied voltage. In this manner, the memristors (112) are "memory resistors" in that they "remember" the last resistance that they had. Memristance is a property of the electronic component referred to as a memristor (112). If charge flows in one direction through a circuit, the resistance of that component of the circuit will increase. If charge flows in the opposite direction in the circuit, the resistance will decrease. If the flow of charge is stopped by turning off the applied voltage, the component will "remember" the last resistance that it had, and when the flow of charge starts again the resistance of the circuit will be what it was when it was last active. A memristor (112) is a resistor device whose resistance can be changed.

Memristors (112) can be made in a number of geometries and using a variety of materials. One form is a metal-insulator-metal memristor (112). The term metal is meant to refer broadly to indicate a conductor, for instance doped silicon. A memristor (112) may include a bottom electrode (metal), a switching layer (insulator), and a top electrode (metal). The bottom electrode is coated with an insulator to form a switching layer. This switching layer is then coated with a layer of another conductive material to form a top electrode. The switching layer may be an insulator between the bottom electrode and the top electrode. For example, in a first state, the switching layer may be insulating such that current does not readily pass between the bottom electrode to the top electrode. Then, during a switching event, the switching layer may switch to a second state, becoming conductive. In a conductive state, the switching layer allows a memristor (112) to store information by changing the memristor state.

In some examples, the top electrode and bottom electrode of the memristor (112) may be formed from a metallic material such as tantalum or a tantalum-aluminum alloy, or other conducting material such as titanium, titanium nitride, copper, aluminum, platinum, and gold among other metallic materials. The switching layer may be made of a metallic oxide. Specific examples of switching layer materials include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented, the switching layer may be ternary and complex oxides such as silicon oxynitride.

A memristor (112) may be classified as an anion device. In an anionic device, the switching mechanism is the formation of oxygen vacancies in the switching layer that are positively charged and therefore lead to the formation of conducting channels in the switching oxide. By comparison, in a cation memristor (112) the conducting channel is formed from an electrochemically active metal such as copper or silver. In some examples, a memristor (112) may be both an anionic device and a cationic device. For example, an aluminum-copper-silicon alloy oxide based memristor (112) could be an anionic device when the copper concentration is low or a cationic device when the copper concentration is high.

Each memristor (112) may be coupled to a selector (118). A selector (118) is a component that either allows current to flow through the memristor (112) or prevents current from flowing through the memristor (112). For example, the selector (118) may have a threshold voltage, $V_{th}$. When a voltage applied across a memristor (112), via a row line (114) and a column line (116), is less than the threshold voltage, the selector (118) is open such that no current flows to a corresponding memristor (112). By comparison, when a voltage applied across a memristor (112), via a row line (114) and a column line (116), is at least as great as the threshold voltage, the selector (118) closes such that current readily flows to a corresponding memristor (112). In this fashion, the selector (118) reduces the sneak current flowing through a crossbar array (110) by preventing current flow through unselected memristors (112). Notwithstanding the selector (118), a sub-threshold voltage current may flow through each memristor (112).

Figure 5:
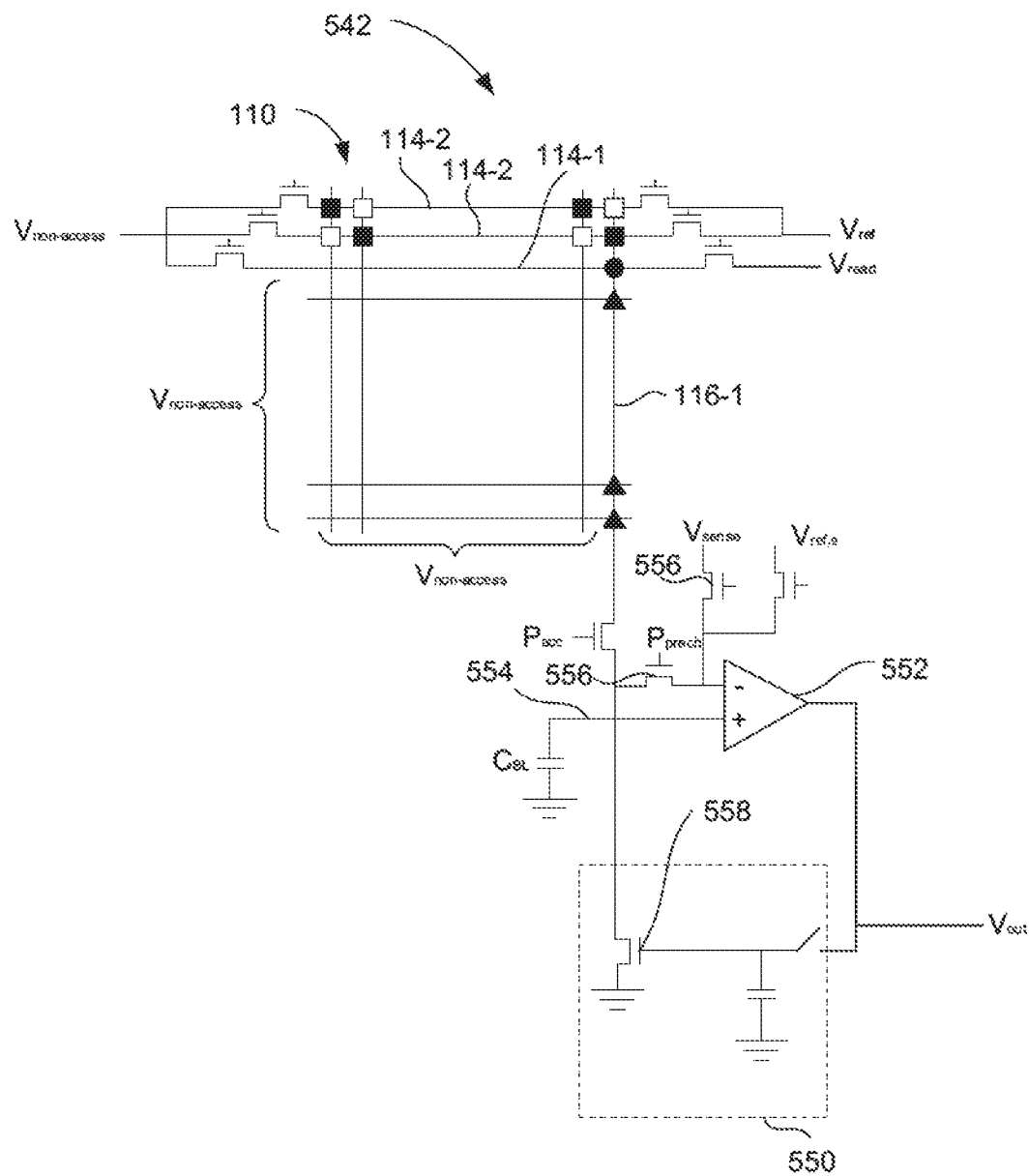
FIG. 5 is a diagram of a circuit for determining a resistance state of a memristor in a crossbar array, according to one example of the principles described herein.

The system (100) may also include a memory controller (102) to determine a resistance value of memristors (112) in a crossbar array (110). The memory controller (102) may be an electrical device or component that, in addition to other functions, operates or controls a memory device. The memory controller (102) may include at least one of circuitry, a processor, or other electrical component. For example, the memory controller (102) may include circuitry such as indicated in FIG. 5.

The memory controller (102) further includes a number of engines used in the implementation of the systems and methods described herein. The engines refer to a combination of hardware such as circuitry and program instructions to perform a designated function. Each of the engines may include a processor and memory. For example, the engines may include circuits and components as part of the example circuit shown in FIG. 5.

The memory controller (102) may include a combined reference-sneak engine (104) to determine a combined reference-sneak current. For example, during a first stage, a reference voltage may be passed to a reference row line (114-2) of the crossbar array (110). In some examples, the reference voltage may be the same value as the read voltage applied later. Similarly, during the first stage, a non-access voltage, such as a half-access voltage may be applied to non-target non-reference row lines (114-3). Also during the first stage, a non-access voltage, such as a half-access voltage may be applied to non-target column lines (116-2). In some examples, a sensing voltage may be applied to the target column line (116-1).

During the first stage, different voltages may be passed to the target row line (114-1). For example, in some cases, the target row line (114-1) may be biased to the half-access voltage. In other examples, while the non-target non-reference row lines (114-3) are biased to the half-access voltage, the target row line (114-1) may be biased to the sense voltage. Biasing the target row line (114-1) to the sense voltage may generate more accurate reading, while biasing the target row line (114-1) to the half-access voltage may conserve power. As will be described later, during the second stage the reference row line (114-2) may be biased similar to how the target row line (114-1) was biased in the first stage. For example, if during the first stage the target row line (114-1) was biased to a half-access voltage, the reference row line (114-2) during the second stage may be similarly biased to the half-access voltage.

Applying a sensing voltage across the target column line (116-1) and voltage such as a half-access voltage or a sensing voltage along the target row line (114-1) may result in a small bias across the target memristor (112-1) during the first stage. A current resultant from the application of these voltages may be collected along the target column line (116-1). For example, the reference voltage along a reference row line (114-2), the non-access voltages applied along the non-target non-reference row lines (114-3) and non-target column lines (116-2), and the sensing voltage applied along the target column line (116-1) along with the resistance of the target memristor (112-1), may result in a current which is collected along the target column line (116-1) that corresponds to the target memristor (112-1). The collected current may be a combined reference-sneak current that includes a reference portion resultant from application of the reference voltage and a sneak current resultant from the application of other voltages in the crossbar array (110).

The memory controller (102) may include a combined read-sneak engine (106) to determine a combined read-sneak current. For example, during a second stage, a read voltage may be passed to a target row line (114-1) of the crossbar array (110). Similarly, during the second stage, a non-access voltage, such as a half-access voltage may be applied to non-target non-reference row lines (114-3). Also during the second stage, a non-access voltage, such as a half-access voltage may be applied to non-target column lines (116-2). In some examples, a sensing voltage may be applied across the target column line (116-1).

During the second stage, different voltages may be passed to the reference row line (114-2). For example, in some cases, the reference row line (114-2) may be biased to the half-access voltage. In other examples, while the non-target non-reference row lines (114-3) are biased to the half-access voltage, the reference row line (114-2) may be biased to the sense voltage. As mentioned above, the voltage to which the reference row line (114-2) is biased during the second stage may be the same voltage to which the target row line (114-1) was biased during the first stage.

Applying a sensing voltage across the target column line (116-1) and a voltage such as a half-access voltage along reference row line (114-2) effectuates a small bias across a memristor (112), similar to the small bias applied across the target memristor (112-1) during the first stage. A current resultant from the application of these voltages may be collected along the target column line (116-1). The collected current may be a combined read-sneak current that includes a read portion resultant from application of the read voltage and a sneak current resultant from the application of other voltages in the crossbar array (110).

The difference between the first stage voltage application and the second stage voltage application is the application of 1) a reference voltage to the reference row line (114-2) and 2) a voltage to the target row line (114-1) in the first stage and the application of 1) a read voltage to the target row line (114-1) and a 2) voltage to the reference row line (114-2) in the second stage. In other words, the difference in output currents from the second stage and the first stage can be attributed to the difference between the resistances of the reference memristor and the target memristor (112-1), for example as the reference voltage and the read voltage may be the same and as the other voltages are applied in both the first stage and the second stage.

However, in some examples, the reference voltage may be set to give a reference current that is half the value of a target memristor current at the read voltage in its low resistance state. Accordingly, when the target memristor (112-1) is in its low resistance state the read current may be twice of the reference current. Yet, when the target memristor (112-1) is in its high resistance state the read current may be smaller than the reference current so that in both cases the difference is large enough for easy sensing.

In other examples, the reference voltage may be same as the read voltage. In this example, the resistance of the target memristor (112-1) will be read as the high resistance state when the current changes from the first stage to the second stage. By comparison, the resistance of the target memristor (112-1) will be read as low when the current remains the same between the first stage and second stage.

The memory controller (102) includes a resistance state engine (108) to determine the resistance state of the memristor (112) based on a difference between the combined reference-sneak current and the combined read-sneak current. In some examples, this may include subtracting the combined reference-sneak current from the combined read sneak current as indicated in the following equation.

$$(I_{read}+I_{sneak})-(I_{ref}+I_{sneak})=(I_{read}-I_{ref})$$ Equation (1).

In Equation 1, the value $(I_{read}-I_{ref})$ may generate a voltage output indicative of the resistance state of the memristor (112).

The memory controller (102) may include other elements that relate to the determination of a resistance state of the target memristor (112-1). For example, the memory controller (102) may include row line (114) and column line (116) selectors that selectively couple the row lines (114) and column lines (116) to voltage sources to apply the various voltages discussed to the row lines (114) and column lines (116).

Using a combined reference-sneak current and combined read-sneak current to determine a resistance state of a memristor (112) may allow for simultaneous comparison of 1) a read current to a reference current to determine a resistance state without an independent reference current source and 2) reduces the effect of sneak current on the determination by accounting for the sneak current in both the first stage and second stage and subtracting the first stage results from the second stage results to cancel the sneak current from the overall output. As the circuitry is reduced, i.e., there is no independent reference current source, the total power consumption of the crossbar array (FIG. 1, 110) is also reduced.

Figure 2:
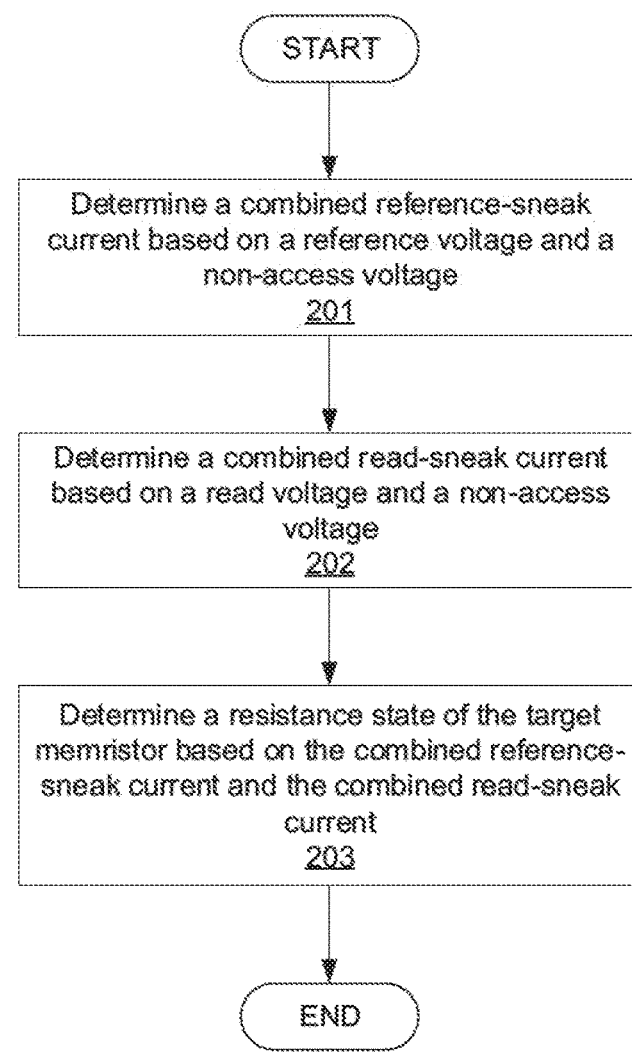
FIG. 2 is a flowchart of a method for determining a resistance state of a memristor in a crossbar array, according to one example of the principles described herein.

FIG. 2 is a flowchart of a method (200) for determining a resistance state of a memristor (FIG. 1, 112) in a crossbar array (FIG. 1, 110), according to one example of the principles described herein. The method (200) includes determining (block 201) a combined reference-sneak current. The combined reference-sneak current may be based on 1) a reference voltage applied to a reference row line (FIG. 1, 114-2) of the crossbar array (FIG. 1, 110), 2) a non-access voltage applied to non-target non-reference row lines (FIG. 1, 114-3) and non-target column lines (FIG. 1, 116-2), 3) a sensing voltage applied to the target column line (FIG. 1, 116-1) of the crossbar array (FIG. 1, 110), and 4) a non-access voltage or a sensing voltage applied to the target row line (FIG. 1, 114-1).

Applying a non-access voltage to non-target non-reference row lines (FIG. 1, 114-3) and non-target column lines (FIG. 1, 116-2) may prevent currents between those lines due to the equipotential effect. Applying the non-access voltage such that both 1) the difference between the reference voltage and the non-access voltage and 2) the difference between the non-access voltage and the sensing voltage are below the threshold voltage of the selector (FIG. 1, 118) reduces the current through the reference row line (FIG. 1, 114-2) and the target column line (FIG. 1, 116-1). The reduction of the total current through the target current decreases the likelihood of an errant read or write.

However, some small sneak current may still be present. Accordingly, the combined reference-sneak current, as well as the subsequently obtained combined read-sneak current, may account for this small sneak current such that upon subtraction the sneak current is cancelled out and an accurate comparison of a read current to a reference current may be obtained.

The method (200) also includes determining (block 202) a combined read-sneak current. The combined read-sneak current may be based on 1) a read voltage applied to a target row line (FIGS. 1.114-1) of the crossbar array (FIG. 1, 110), 2) a non-access voltage applied to non-target non-reference row lines (FIG. 1, 114-3) and non-target column lines (FIG. 1, 116-2), 3) a sensing voltage applied to the target column line (FIG. 1, 116-1), and 4) a non-access voltage or a sensing voltage applied to the reference row line (FIG. 1, 114-2). Passing the same voltage to the reference row line (FIG. 1, 114-2) may imitate the sensing voltage (or non-access voltage) that was applied to the target row line (FIG. 1, 114-1) previously so as to cancel out their respective effects in the comparison of the combined reference-sneak current and the combined read-sneak current.

In some examples, determining (block 201) a combined reference-sneak current may be performed in a first stage and determining (block 202) a combined read-sneak current may be performed in a second stage. In this first stage the combined reference-sneak current may be stored so as to be compared to the subsequently obtained combined read-sneak current.

Then, in the second and subsequent stage, the voltage applied to the reference row line (FIG. 1, 114-2) may be reduced to the same voltage as was applied to the target row line (FIG. 1, 114-1) in the first stage and the voltage applied to the target row line (FIG. 1, 1141) may be raised to the read voltage. The other voltages may be maintained between the first stage and the second stage. In other words, 1) the non-access voltages applied to non-target non-reference row lines (FIG. 1, 114-3) and non-target column lines (FIG. 1, 116-2) and 2) the sensing voltage applied to a target column line (FIG. 1, 116-1) may be held constant between the first and second stages.

The method (200) includes determining (block 203) a resistance state of the target memristor (FIG. 1, 112-1) based on the combined reference-sneak current and the combined read-sneak current. For example, in the second stage, the combined reference-sneak current may be collected from storage, i.e., a switch may be opened connecting the sample and hold circuit to a comparator. In comparing the combined reference-sneak current and the combined read-sneak current, the sneak component is subtracted out such that the difference between the combined reference-sneak current and the combined read-sneak current is effectively a difference between the read current and the reference current, which difference is used to determine the resistance state of the memristor (FIG. 1, 112).

For example, a reference voltage may be selected such that the reference current is between 1) an anticipated current from a memristor (FIG. 1, 112) in a low resistance state and 2) an anticipated current from a memristor (FIG. 1, 112) in a high resistance state. Accordingly, when the memristor (FIG. 1, 112) is in a low resistance state the read current may be larger than the reference current and one voltage output may be detected. By comparison, when the memristor (FIG. 1, 112) is in a high resistance state, the read current may be smaller than the reference current and a different voltage output, relative to the output when the memristor (FIG. 1, 112) is in a low resistance state, may be detected.

In some examples, the reference memristors are the same as other memristors in the crossbar array (FIG. 1, 110) and is set to its low resistance state. By doing so the reference memristors have properties similar to other memristors that use the reference memristors as reference when they are read. Accordingly, even in the presence of variations in a memory chip, the reference memristors follow the same trend as the rest of the memristors, which may lead to an accurate reference current and accurate determination of the resistance state of a target memristor cell.

Using combined reference-sneak currents and combined read-sneak currents to determine a resistance state of a memristor (FIG. 1, 112) may allow for simple determination of resistance state without relying on additional circuitry. For example, as the reference memory cells have the same characteristics as the surrounding memory cells, the first stage may consistently provide a suitable reference for the surrounding memory cells. By comparison, when an external reference current is used, the current is fixed while the memory cells may change depending on the particular fabrication conditions and such an external reference current may not provide an adequate reference current. Moreover, the crossbar array (FIG. 1, 110) as described herein may be simpler and offer power consumption reduction given that this accurate reference current can be generated without much additional circuits.

Figure 3:
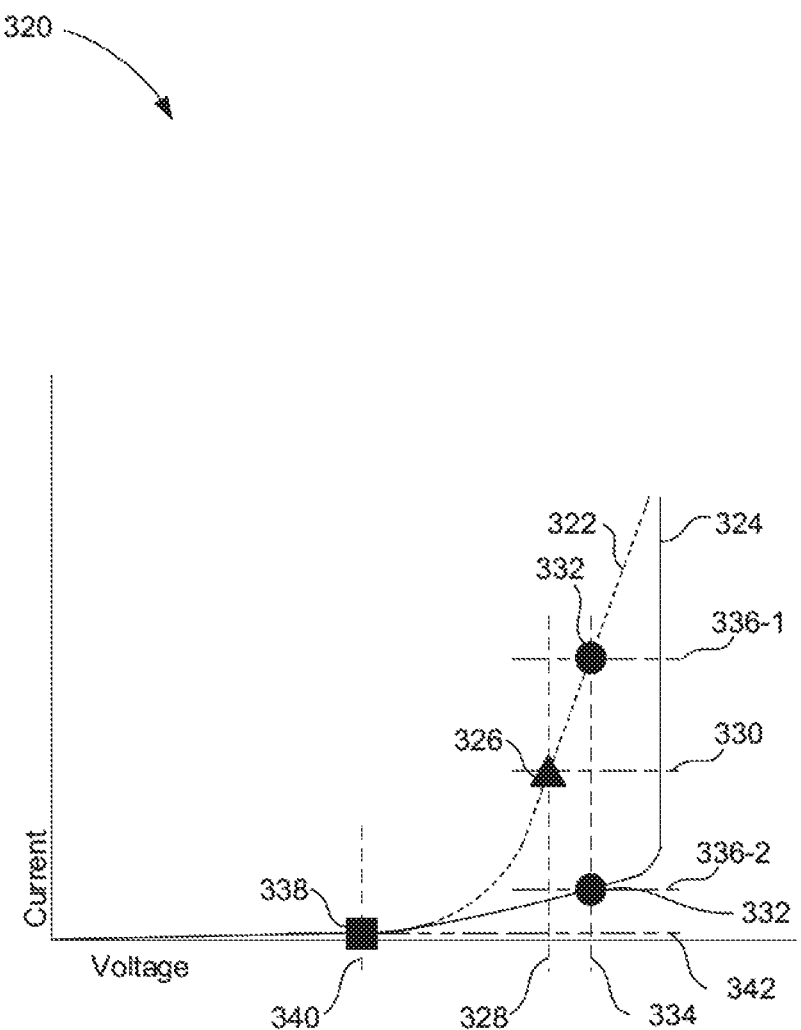
FIG. 3 is a current-voltage plot showing the operation of the system for determining a resistance state of a memristor in a crossbar array, according to one example of the principles described herein.

FIG. 3 is a current-voltage plot (320) showing the operation of the system (FIG. 1, 100) for determining a resistance state of a memristor (FIG. 1, 112) in a crossbar array (FIG. 1, 110), according to one example of the principles described herein. The plot (320) shows voltage along the x-axis and current along the y-axis. The I-V characteristics of a memristor (FIG. 1, 112) in a low resistance state and a high resistance state are indicated by the lines (322) and (324), respectively.

As described above, during a first stage, a reference voltage, $V_{ref}$, is applied to a reference row line (FIG. 1, 114-2) and a sensing voltage, $V_{sense}$, is applied to a target column line (FIG. 1, 116-1) such that the voltage drop across a memristor (FIG. 1, 112) found at the intersection of the reference row line (FIG. 1, 114-2) and the target column line (FIG. 1, 116-1) indicated by the triangle (326) may be a value $V_{(ref-sense)}$ (328). In some examples, prior to application of the reference voltage, the memristor (FIG. 1, 112) may be placed in a low resistance state. The voltage drop $V_{(ref-sense)}$ (328) may result in a detected current along the target column line of $I_{(ref-sense)}$ (330).

Similarly, during a second stage, a read voltage, $V_{read}$, is applied to a target row line (FIG. 1, 114-1) and a sense voltage, $V_{sense}$, is applied to a target column line (FIG. 1, 116-1) such that the voltage drop across a memristor (FIG. 1, 112) found at the intersection of the target row line (FIG. 1, 114-1) and the target column line (FIG. 1, 116-1) indicated by the circles (332) may be a value $V_{(read-sense)}$ (334). The voltage drop $V_{(read-sense)}$ (334) may result in a detected current along the target column line of $I_{(read-sense)}$ (336) that is dependent upon the resistance state of the memristor (FIG. 1, 112). For example, as $V_{read}$ and $V_{ref}$ may be the same, any difference between the respective output currents (336-1, 336-2) is based on the resistance state of the memristor. For example, if the memristor (FIG. 1, 112) is in a low resistance state, the $I_{(read-sense)}$ (336-1) may be greater than the value $I_{(ref-sense)}$ (330). By comparison, if the memristor (FIG. 1, 112) is in a high resistance state, the $I_{(read-sense)}$ (336-2) may be less than the value $I_{(ref-sense)}$ (330). Accordingly, a resistance state of the memristor (FIG. 1, 112) may be determined by comparing the $I_{(read-sense)}$ (336) values to the $I_{(ref-sense)}$ (330) value.

Some memristors (FIG. 1, 112) in the crossbar array (FIG. 1, 110) may have a minimal amount of current flowing through them. For example, memristors (FIG. 1, 112) along both a non-target non-reference row line (FIG. 1, 114-3) and a non-target column line (FIG. 1, 116-2) may have close to zero current flowing through them. Such memristors (FIG. 1, 112) may be referred to as unselected memristors (FIG. 1, 112).

However, a number of partially-selected memristors (FIG. 1, 112), i.e., those falling along either the target row line (FIG. 1, 114-1) or the target column line (FIG. 1, 116-1) that are not the target memristor (FIG. 1, 112-1) may see a voltage drop, albeit less than the voltage drop across the target memristor (FIG. 1, 112).

For example, during both the first stage and second stage, a non-access voltage, $V_{non-access}$, is applied to non-target non-reference row lines (FIG. 1, 114-3) and a sensing voltage, $V_{sense}$, is applied to a target column line (FIG. 1, 116-1) such that the voltage drop across partially-selected memristors (FIG. 1, 112), i.e., memristors (FIG. 1, 112) along either the target row line (FIG. 1, 114-1) or the target column line (FIG. 1, 116-1), indicated by the square (338), may be a value $V_{(non-access-sense)}$ (340). The voltage drop $V_{(non-access-sense)}$ (340) may result in a sneak current of $I_{(non-access-sense)}$ (342). As can be seen in FIG. 3, the values of the voltages applied may be selected such that the sneak current, $I_{(non-access-sense)}$ (342) passing through an individual non-target memristor (FIG. 1, 112-2) is small. However, the total sneak current from all non-target memristors (FIG. 1, 112-2) may be large as there are many row lines (FIG. 1, 114) and column lines (FIG. 1, 116) in the crossbar array (FIG. 1, 110). Accordingly, as described in an example below, the crossbar array (FIG. 1, 110) may include a sneak current subtraction component to subtract the total sneak current to determine a resistance state of the target memristors (FIG. 1, 112).

As can be seen in FIG. 3, the systems and methods described herein allow for effective determination of resistance state of memristors (FIG. 112) by providing an effective current via the reference row line (FIG. 1, 114-2) which includes memristors (FIG. 1, 112) having similar characteristics to memristors (FIG. 1, 112) in other row lines (FIG. 1, 114).

Figure 4:
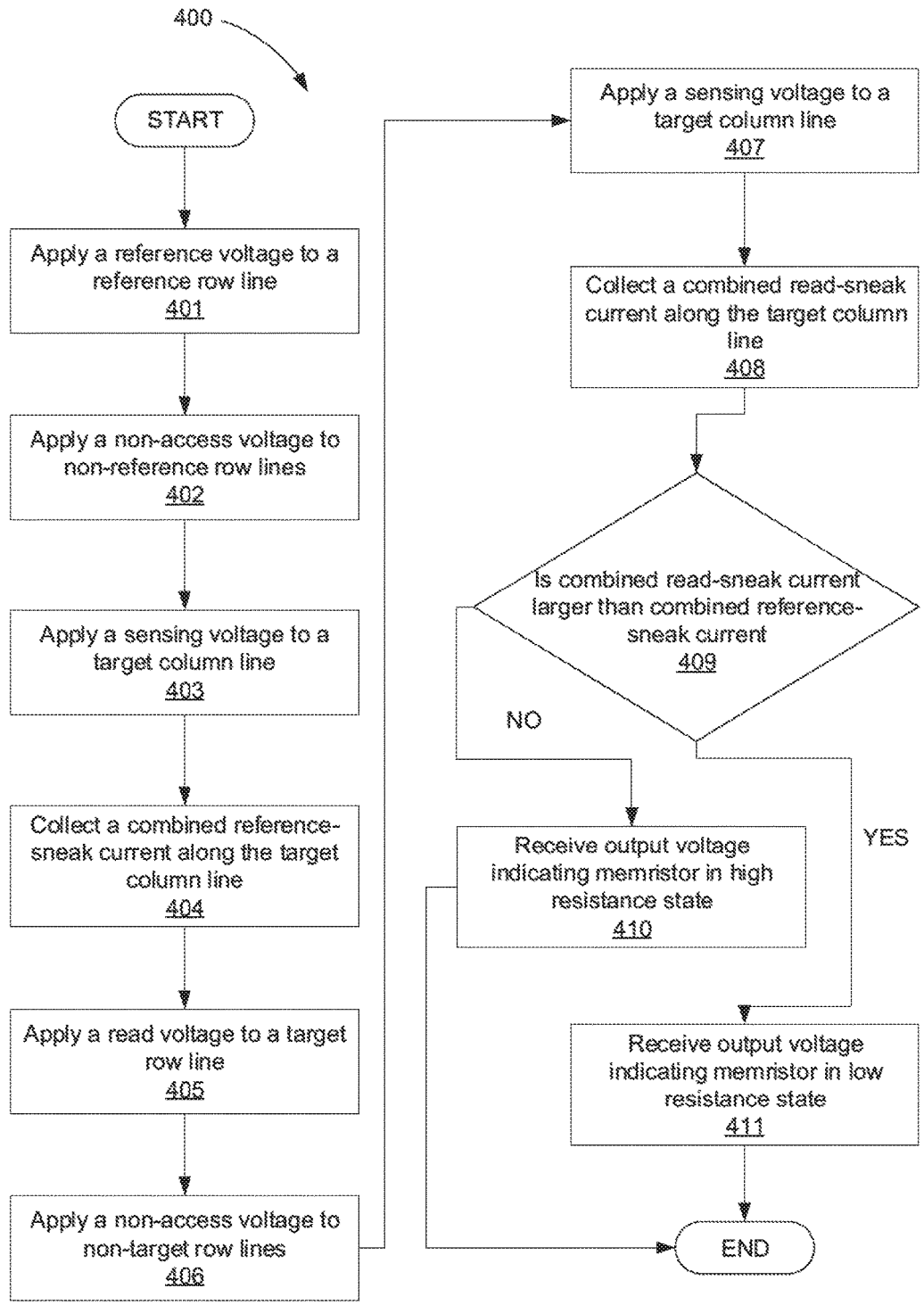
FIG. 4 is a flowchart of a method for determining a resistance state of a memristor in a crossbar array, according to another example of the principles described herein.

FIG. 4 is a flowchart of a method (400) for determining a resistance state of a memristor (FIG. 1, 112) in a crossbar array (FIG. 1, 110), according to another example of the principles described herein. The method (400) may include applying (block 401) a reference voltage to a reference row line (FIG. 1, 114-2) of the crossbar array (FIG. 1, 110). In some examples, the reference voltage may be selected such that a resultant current may be between 1) an anticipated current for a memristor (FIG. 1, 112) in a low resistance state and 2) an anticipated current for a memristor (FIG. 1, 112) in a high resistance state. Selecting a reference voltage between these two anticipated currents may allow for a determination as to whether the target memristor (FIG. 1, 112-1) is in a high or low resistance state, as will be described below. In some examples, the reference voltage may be the same as the read voltage, which may eliminate the use of a separate voltage source.

The reference row line (FIG. 1, 114-2) may be a row line (FIG. 1, 114) of the crossbar array (FIG. 1, 110) that has the same selectors (FIG. 1, 118) and memristors (FIG. 1, 112) as other row lines (FIG. 1, 114) of the crossbar array (FIG. 1, 110) such that the response to an applied voltage along the reference row line (FIG. 1, 114-2) may be similar to the response of voltages applied along other row lines (FIG. 1, 114).

The method (400) also includes applying (block 402) a non-access voltage to non-target non-reference row lines (FIG. 1, 114-3). In other words, a crossbar array (FIG. 1, 110) may include a reference row line (FIG. 1, 114-2) and a target row line (FIG. 1, 114-1). The remaining row lines (FIG. 1, 114-3), that are not the reference row line (FIG. 1, 114-2) nor the target row line (FIG. 1, 114-1) may receive a non-access voltage. In some examples, the non-access voltage may be a fractional amount of the read voltage that is subsequently applied to the target row line (FIG. 1, 114-1). For example, to determine a resistance state of a target memristor (FIG. 1, 112-1), a voltage drop across the target memristor (FIG. 1, 112-1) may be effectuated by applying a read voltage V, across the target memristor (FIG. 1, 112-1) via target row line (FIG. 1, 114-1) and the target column line (FIG. 1, 116-1). The remaining row lines (FIG. 1, -voltage of V/2 or less (i.e., V/3, V/4) throughout the operation. Applying (block 402) a non-access voltage to non-target non-reference row lines (FIG. 1, 114-3) may prevent currents from the unselected rows to the unselected columns to reduce sneak currents to decrease the likelihood of an errant read or write. In other words, applying (block 402) a non-access voltage to non-target non-reference row lines (FIG. 1, 114-3) may ensure that the voltage potential across the partially-selected memristors (FIG. 1, 112) is below the threshold voltage of their corresponding selectors (FIG. 1, 118). As will be described below, the non-access voltage may be applied both during a first stage and second stage of the method (400).

The method (400) may include applying (block 403) a sensing voltage to a target column line (FIG. 1, 116-1). More specifically, the sensing voltage may be applied (block 403) while a reference voltage is being applied (block 401) to the reference row line (FIG. 1, 114-2). The sensing voltage may be a voltage used at least in part to effectuate a voltage drop across a target memristor (FIG. 1, 112-1) when performing a read operation.

In some examples, while a sensing voltage is being applied (block 403) to a target column line (FIG. 1, 116-1), a non-access voltage or sensing voltage may be applied to the target row line (FIG. 1, 114-1). The non-access voltage applied to the target row line (FIG. 1, 114-1) may be a half-access voltage which may reduce the power consumption. In other example, while a sensing voltage is being applied (block 403) to a target column line (FIG. 1, 116-1), the non-access voltage applied to the target row line (FIG. 1, 114-1) may be a sensing voltage, which may improve reading accuracy.

The method (400) includes collecting (block 404) a combined reference-sneak current (FIG. 3, 330) along the target column line (FIG. 1, 116-1). For example, based on the voltages applied (reference voltage, non-access voltage, sensing voltage, and voltage applied to the target row line (FIG. 1, 114-1) in the first stage), and the resistance of the memristors (FIG. 1, 112) in the crossbar array (FIG. 1, 110) there may be a current flowing through the crossbar array (FIG. 1, 110) along the column lines (FIG. 1, 116). The current flowing through a target column line (FIG. 1, 116-1) may be collected as a combined reference-sneak current (FIG. 3, 330) which includes a component resultant from the reference voltage and a sneak portion resultant from the other voltages applied. In some examples, blocks 401-404 may be applied in a first stage, such as a sampling stage. While FIG. 4 depicts block 401-404 occurring in a particular order within the first stage, the operations may be performed in any order, or concurrently.

The method (400) may include applying (block 405) a read voltage to a target row line (FIG. 1, 114-1) of the crossbar array (FIG. 1, 110). In other words, the voltage applied to the target row line (FIG. 1, 114-1) in the sampling stage, i.e., a non-access voltage such as a sensing voltage or a half-access voltage, may be raised to a read voltage level. The read voltage being such that the difference between the read voltage and the sensing voltage is greater than the threshold voltage of the selector (FIG. 1, 118) so as to allow current to flow through the target memristor (FIG. 1, 112-1), but being less than a switching voltage of the target memristor (FIG. 1, 112-1) so as to avoid an inadvertent switch of the memristor (FIG. 1, 112) resistance state.

The method (400) also includes applying (block 406) a non-access voltage to non-target non-reference row lines (FIG. 1, 114-3). In other words, the voltage applied to the non-target non-reference row lines (FIG. 1, 114-3) in the sampling stage, i.e., a non-access voltage, may be maintained during a second stage, such as a read stage. Maintaining the non-access voltage across non-target non-reference row lines (FIG. 1, 114) may allow for sneak current resultant from the non-access voltages to be nulled during determination of a resistance state of the memristor (FIG. 1, 112). In other words, as the same sneak current, i.e., the current resultant from the non-access voltages, is present in the combined reference-sneak current (FIG. 3, 330) and a subsequently obtained combined read-sneak current (FIG. 3, 336), then the sneak current component is accounted for in both, and therefore does not inhibit the accurate determination of a resistance state based on a reference current and a read current.

The method (400) may include applying (block 407) a sensing voltage to a target column line (FIG. 1, 116-1). More specifically, the sensing voltage may be applied (block 407) while a read voltage is being applied (block 405) to the target row line (FIG. 1, 114-1). In some examples, while a sensing voltage is being applied (block 407) to a target column line (FIG. 1, 116-1), a non-access voltage or a sensing voltage may be applied to the reference row line (FIG. 1, 114-2). Applying (block 407) a sensing voltage to a target column line (FIG. 1, 116-1) and a non-access voltage or sensing voltage to the reference row line (FIG. 1, 114-2) is a sister operation in the second stage to applying the sensing voltage to the target column line (FIG. 1, 116) and a non-access voltage or a sensing voltage to the target row line (FIG. 1, 114-1) in the first stage. Performing these similar operations in different stages eliminates their effect during comparison (due to their presence in both stages) of combined currents. Thus, similar to the sneak current, the effects of a sensing voltage applied to partially-selected memristors (FIG. 1, 112) is reduced, such that just the voltages across the target memristor (FIG. 1, 112) are sensed and compared.

The method (400) includes collecting (block 408) a combined read-sneak current (FIG. 3, 336) along the target column line (FIG. 1, 116-1). For example, based on the voltages applied (read voltage, non-access voltage, sensing voltage, and a voltage (sensing or non-access) applied to the reference row line (FIG. 1, 114-2) during the second stage)), and the resistance of the memristors (FIG. 1, 112) in the crossbar array (FIG. 1, 110) there may be a current flowing through the crossbar array (FIG. 1, 110) along the column lines (FIG. 1, 116). The current flowing through a target column line (FIG. 1, 116-1) may be collected as a combined read-sneak current (FIG. 3, 336) which includes a component resultant from the read voltage and a sneak portion resultant from the other voltages applied. While FIG. 4 depicts blocks 405-408 occurring in a particular order within the second stage, the operations may be performed in any order, or concurrently.

The method (400) includes determining (block 409) whether the combined read-sneak current (FIG. 3, 336) is larger than the combined reference-sneak current (FIG. 3, 330). If the combined read-sneak current (FIG. 3, 336) is larger than the combined reference-sneak current (FIG. 3, 330) (block 409, determination YES), it may be determined that the memristor (FIG. 1, 112) is in a low resistance state, and a voltage so indicating may be output (block 411). By comparison, if the combined read-sneak current (FIG. 3, 336) is not larger than the combined read-sneak current (FIG. 3, 330) (block 409, determination NO), it may be determined that the memristor (FIG. 1, 112) is in a high resistance state, and a voltage so indicating may be output (block 410). In some examples, blocks 405-411 may be performed in a second stage, such as a read stage.

FIG. 5 is a diagram of a circuit (542) for determining a resistance state of a memristor (FIG. 1, 112) in a crossbar array (110), according to one example of the principles described herein. As described above, the memory controller (FIG. 1, 102) may include a number of elements such as processors and circuits to carry out the functionality of determining a resistance state of a memristor (FIG. 1, 112) in a crossbar array (110). FIG. 5 depicts an example of some circuitry that may be used. In FIG. 5, a target row line (114-1), a number of reference row lines (114-2) and a target column line (116-1) are indicated by a reference number and for simplicity the remaining row lines (FIG. 1, 114) and column lines (FIG. 1, 116) are not labeled. The location of a target memristor (FIG. 1, 112) may be indicated by a circle. The location of reference memristors (FIG. 1, 112) may be indicated by squares; filled squares representing memristors (FIG. 1, 112) in a high resistance state and unfilled squares representing memristors (FIG. 1, 112) in a low resistance state. The location of partially-selected memristors (FIG. 1, 112) may be indicated by triangles.

As depicted in FIG. 5, the circuit (542) may include two reference rows (114-2) of complementary memristors (FIG. 1, 112). For example, a first number of memristors (FIG. 1, 112) in a first reference row (114-2) may be in a low resistance state and a second number of memristors (FIG. 1, 112) in the first reference row (114-2) may be in a high resistance state. The second reference row (114-2) may also include a first number of high resistance memristors (FIG. 1, 112) and a second number of low resistance memristors (FIG. 1, 112). The high resistance memristors (FIG. 1, 112) in the first reference row (114-1) may be staggered with the low resistance memristors (FIG. 1, 112) in the second reference row (114-2) as depicted in FIG. 5. In other words, each of the first number of memristors (FIG. 1, 112), in their low resistance state, in the first reference row (114-2) may share a column with one of the first number of memristors (FIG. 1, 112), in their high resistance state in the second reference row (114-2). This complementary arrangement may be more representative of the characteristics of the target row line (114-1) as it has half of the cells on the reference row line (114-2) in their low resistance state. When a particular column line (116) is selected, the appropriate reference row (114-2) should be selected to engage the right low resistance reference cell.

As described above, during a first stage, a non-access voltage, $V_{non-access}$, such as a fractional voltage of the read voltage may be applied to non-target non-reference row lines (FIG. 1, 114-3) and non-target column lines (FIG. 1, 116-2) and a sensing voltage, $V_{sense}$, may be applied to a target column line (116-1). Doing so may result in a voltage drop across a number of partially-selected memristors of $V_{(non-access-sense)}$. Similarly, during the first stage a reference voltage, $V_{ref}$, may be applied to a reference row line (114-2) to result in a voltage drop across the reference memristor of $V_{(ref-sense)}$. Still further, a sensing voltage, $V_{sense}$, may be applied to the target column line (116-1) and in some examples a target row line (114-1). In some examples, the resultant current from these applied voltages, i.e., the combined reference-sneak current (FIG. 3, 330) may be output and stored in a sample and hold circuit (550). The sample and hold circuit (550) may include a diode-connected metal-oxide semiconductor field-effect transistor (MOSFET) with a storage capacitor coupled to the gate. The sum of the sneak current from the unselected row lines (FIG. 1, 114) and the reference current through the reference memristor flows through the target column line (116-1), which generates a voltage between the gate and source and the voltage is stored in the storage capacitor. Once the voltage is stabilized, the connection between the gate and drain is disconnected and the storage capacitor stores the voltage.

Similarly, as described above, during a second stage, a non-access voltage, $V_{non-access}$, such as a fractional voltage of the read voltage may be maintained to non-target non-reference row lines (FIG. 1, 114-3) and non-target column lines (FIG. 1, 116-2) and a sensing voltage, $V_{sense}$, may be applied to a target column line (116-1). Similarly during the second stage a read voltage, $V_{read}$, may be applied to a target row line (FIG. 1, 114-1) to result in a voltage drop across the target memristor of $V_{(read-sense)}$. Still further, a sensing voltage, $V_{sense}$, applied to the target column line (116-1) and in some examples, the reference row line (114-2). The bias across the reference memristor emulates the bias previously passed across the target memristor to further increase the effectiveness of the read operation by removing the effects of non-reference and non-read voltages, to isolate the currents resultant from the reference voltage and the read voltage. In some examples, the resultant current from these applied voltages, i.e., the combined read-sneak current (FIG. 3, 336), may be output. During the read operation, the combined reference-sneak current (FIG. 3, 330) may be collected from the sample and hold circuit (550), by opening a switch for example, and compared to the combined read-sneak current (FIG. 3, 336) via the comparator (552). For example, while the combined reference-sneak current is flowing out of the sense node (554) through the sample and hold circuit (550), the combined read-sneak current is injected into the sense node (554) from the array. An output voltage reflective of the difference between the combined reference-sneak current (FIG. 3, 330) and the combined read-sneak current (FIG. 3, 336) is generated and analyzed to determine the resistance state of the target memristor (FIG. 1, 112-1).

The circuit may include a clamping circuit. The clamping circuit may be used to maintain constant the voltage of the target column line (116-1). For example, the voltage at the top of the sample and hold circuit (550) may vary to accurately sample the current. If the voltage out of the sample and hold circuit (550) varies, the voltage applied to the target column line (116-1) will also vary, resulting in variations of voltage across the partially selected memory cells and the reference cells. To prevent this variation, a clamping circuit may be used which includes an operational amplifier (552) and a transistor (556). If the voltage of a sensing node (554) goes above the sense voltage then the output of the operational amplifier (552) may become more positive. This may drive the gate of the transistor (558) at the top of the sample and hold circuit (550) to increase the current through the drain which will lower the voltage of the sense node (554). If the sense node (554) voltage goes below the sensing voltage, the opposite will occur, i.e., it will drive the voltage up.

The circuit (542) may include other components such as a bit line capacitor, "$C_{BL}$" which determines the response time of the clamping circuit and the sampling circuit; "$P_{prech}$" which is a control pulse input to precharge the bit line to $V_{sense}$; "$P_{acc}$" is a control pulse input to connect a target column line (116-1) to the sensing circuit. "$V_{ref,s}$" may be used to indicate whether the combined read-sneak current is larger or smaller than the combined reference-sneak current. For example, depending on the situation, the voltage at the sensing node (554) may increase or decrease and the $V_{ref,s}$ may be used to compare the sensing voltage at the sensing node (554). As indicated in FIG. 5, a number of transistors may be placed between the reference row lines (114-2) and target row lines (114-1) and various voltage sources.

Figure 6:
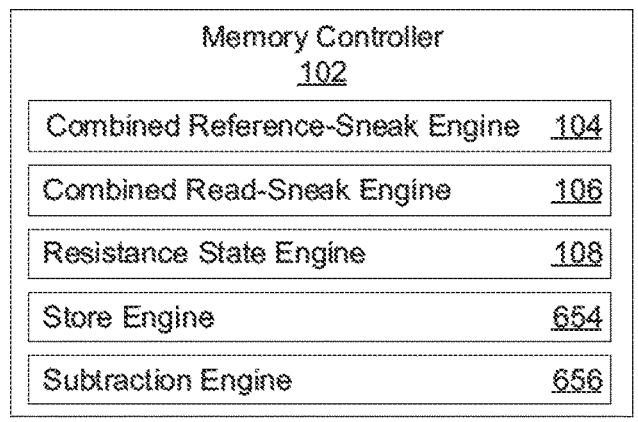
FIG. 6 is a diagram of a memory controller, according to the one example of the principles described herein.

FIG. 6 is a diagram of a memory controller (102) according to one example of the principles described herein. The memory controller (102) includes a combined reference-sneak engine (104), combined read-sneak engine (106), and resistance state engine (108) that may be examples of similar components described in connection with FIG. 1. The memory controller (102) may also include a store engine (654) and a subtraction engine (656). The engines (104, 106, 108, 654, 656) refer to a combination of hardware and program instructions to perform a designated function. Each of the engines (104, 106, 108, 654, 656) may include circuitry. Program instructions may be stored in memory and cause the processor to execute the designated function of the engine.

The store engine (654) stores the combined reference-sneak current (FIG. 3, 330). For example, the store engine (654) may include circuitry to sample and hold the combined reference-sneak current (FIG. 3, 330). The subtraction engine (656) subtracts the combined reference-sneak current (FIG. 3, 330) from the combined read-sneak current (FIG. 3, 336). For example, the subtraction engine (656) may include the operational amplifier (FIG. 5, 552).

Figure 7:
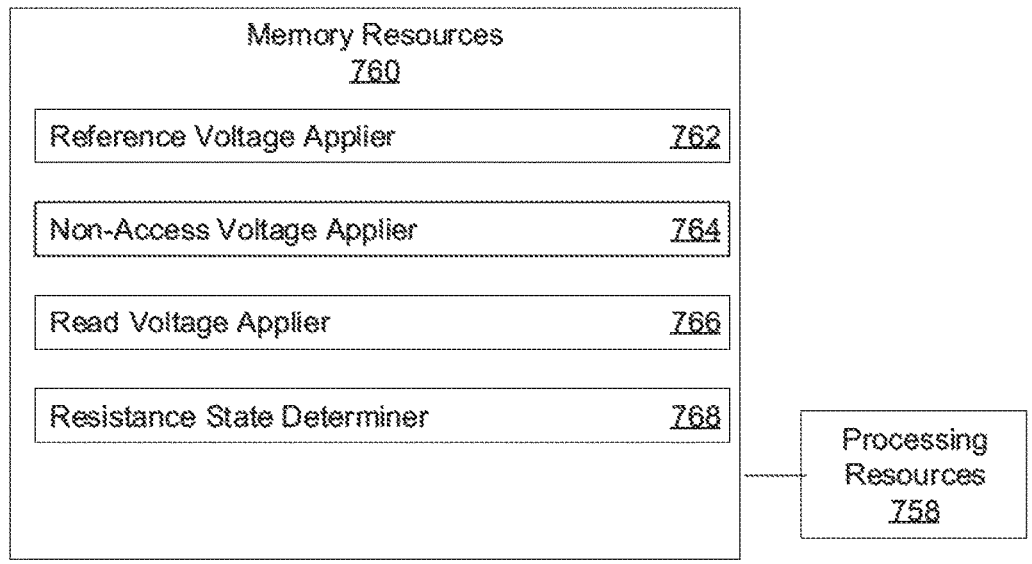
FIG. 7 is a diagram of a memory controller, according to one example of the principles described herein.

FIG. 7 is a diagram of a memory controller (102), according to one example of the principles described herein. In this example, the memory controller (102) includes processing resources (758) that are in communication with memory resources (760). Processing resources (758) include at least one processor and other resources used to process programmed instructions. The memory resources (760) represent generally any memory capable of storing data such as programmed instructions or data structures used by the memory controller (102). The programmed instructions shown stored in the memory resources (760) include a reference voltage applier (762), a non-access voltage applier (764), a read voltage applier (766), and a resistance state determiner (768).

The memory resources (760) include a computer readable storage medium that contains computer readable program code to cause tasks to be executed by the processing resources (758). The computer readable storage medium may be tangible and/or non-transitory storage medium. The computer readable storage medium may be any appropriate storage medium that is not a transmission storage medium. A non-exhaustive list of computer readable storage medium types includes non-volatile memory, volatile memory, random access memory, memristor based memory, write only memory, flash memory, electrically erasable program read only memory, magnetic storage media, other types of memory, or combinations thereof.

The reference voltage applier (762) represents programmed instructions that, when executed, cause the processing resources (758) to apply a reference voltage to a reference row line (FIG. 1, 114-2) of a crossbar array (FIG. 1, 110); for example by signaling a voltage source to apply the reference voltage to the reference row line (FIG. 1, 114-2). The non-access voltage applier (764) represents programmed instructions that, when executed, cause the processing resources (758) to apply a non-access voltage to non-target non-reference row lines (FIG. 1, 114-3) and non-target column lines (FIG. 1, 116-2) of a crossbar array (FIG. 1, 110) or combinations thereof; for example by signaling a voltage source to apply the non-access voltage to the non-target non-reference row lines (FIG. 1, 114-3) and non-target column lines (FIG. 1, 116-2). The read voltage applier (766) represents programmed instructions that, when executed, cause the processing resources (758) to apply a read voltage to a target row line (FIG. 1, 114-1) of a crossbar array (FIG. 1, 110); for example by signaling a voltage source to apply the read voltage to the target row line (FIG. 1, 114-1).

The resistance state determiner (768) represents programmed instructions that, when executed, cause the processing resources (758) to determine a resistance state of a target memristor (FIG. 1, 112-1) based on the applied reference voltage, non-access voltage, and the read voltage. For example, the resistance state determiner (768) may include circuitry to compare the combined reference-sneak current (FIG. 3, 330) and the combined read-sneak current (FIG. 3, 336).

Further, the memory resources (760) may be part of an installation package. In response to installing the installation package, the programmed instructions of the memory resources (760) may be downloaded from the installation package's source, such as a portable medium, a server, a remote network location, another location, or combinations thereof. Portable memory media that are compatible with the principles described herein include DVDs, CDs, flash memory, portable disks, magnetic disks, optical disks, other forms of portable memory, or combinations thereof. In other examples, the program instructions are already installed. Here, the memory resources can include integrated memory such as a hard drive, a solid state hard drive, or the like.

In some examples, the processing resources (758) and the memory resources (760) are located within the same physical component, such as a server, or a network component. The memory resources (760) may be part of the physical component's main memory, caches, registers, non-volatile memory, or elsewhere in the physical component's memory hierarchy. Alternatively, the memory resources (760) may be in communication with the processing resources (758) over a network. Further, the data structures, such as the libraries and may be accessed from a remote location over a network connection while the programmed instructions are located locally. Thus, the memory controller (102) may be implemented on a user device, on a server, on a collection of servers, or combinations thereof.

The memory controller (102) of FIG. 7 may be part of a general purpose computer. However, in alternative examples, the memory controller (102) is part of an application specific integrated circuit.

The processing resources (758) may include the hardware architecture to retrieve executable instructions from the memory resources (760) and execute the executable instructions. The executable instructions may, when executed by the processing resources (758), cause the processing resources (758) to implement at least the functionality of determining a resistance state of a memristor (FIG. 1, 112).

The memory resources (760) may store data such as executable instructions that are executed by the processing resources (758) or other processing device. As will be discussed, the memory resources (760) may specifically store instructions representing a number of applications that the processing resources (758) executes to implement at least the functionality described herein.

The memory resources (760) may include a machine readable medium, a machine readable storage medium, or a non-transitory machine readable medium, among others. For example, the memory resources (760) may be an electronic, magnetic, optical, electromagnetic, infrared, or semiconductor system, apparatus, or device, or any suitable combination of the foregoing. In the context of this document, a machine readable storage medium may be any tangible medium that can contain, or store machine readable instructions for use by or in connection with an instruction execution system, apparatus, or device. In another example, a machine readable storage medium may be any non-transitory medium that can contain, or store a program for use by or in connection with an instruction execution system, apparatus, or device.

Aspects of the present system and method are described herein with reference to flowchart illustrations and/or block diagrams of methods, apparatus (systems) and instruction sets according to examples of the principles described herein. Each block of the flowchart illustrations and block diagrams, and combinations of blocks in the flowchart illustrations and block diagrams, may be implemented by machine readable instructions. The machine readable instructions may be provided to a processing resources (758) of a general purpose computer, special purpose computer, or other programmable data processing apparatus to produce a machine, such that the machine readable instructions, when executed via, for example, the processing resources (758) or other programmable data processing apparatus, implement the functions or acts specified in the flowchart and/or block diagram block or blocks. In one example, the machine readable instructions may be embodied within a machine readable storage medium; the machine readable storage medium being part of the computer program product. In one example, the machine readable storage medium is a non-transitory machine readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A method for determining a resistance state of a memristor in a crossbar array, the method comprising:
   determining a combined reference-sneak current based on a reference voltage applied to a reference row line, a sense voltage applied to a target column line, and a first voltage applied to a target row line, including applying a non-access voltage to non-target and non-reference row lines and non-target column lines of the crossbar array, the reference voltage and the first voltage different than the non-access voltage;
   determining a combined read-sneak current based on a read voltage applied to the target row line, the sense voltage applied to the target column line, and a second voltage applied to the reference row line, including applying the non-access voltage to the non-target and non-reference row lines and the non-target column lines of the crossbar array, the read voltage and the second voltage different than the non-access voltage, wherein the second voltage applied to the reference row line is the sense voltage and wherein determining the combined read-sneak current comprises:
      applying the read voltage to the target row line of the crossbar array,
      applying the sense voltage to the target column line,
      applying the second voltage to the reference row line, and
      collecting the combined read-sneak current along the target column line; and
   determining a resistance state of a target memristor based on the combined reference-sneak current and the combined read-sneak current.

2. The method of claim 1, further comprising setting a reference memristor in the reference row line to a low resistance state.

3. The method of claim 1, wherein determining the combined reference-sneak current comprises:
   applying the reference voltage to the reference row line of the crossbar array;
   applying the sense voltage to the target column line;
   applying the first voltage to the target row line; and
   collecting the combined reference-sneak current along the target column line.

4. The method of claim 3, wherein the first voltage applied to the target row line is the sense voltage.

5. The method of claim 1, wherein determining the resistance state of the target memristor based on the combined reference-sneak current and the combined read-sneak current includes outputting, as a voltage, a comparison of the combined reference-sneak current and the combined read sneak-current, wherein:
   a higher output voltage indicates the memristor is in a first resistance state; and
   a lower output voltage, relative to the higher output voltage, indicates the memristor is in a second resistance state.

6. The method of claim 1, wherein:
   determining the combined reference-sneak current is performed during a first stage; and
   determining the combined read-sneak current is performed during a second stage.

7. A system for determining a resistance state of a memristor in a crossbar array, the system comprising:
   a crossbar array of memristors, the crossbar array comprising:
      a number of row lines, including a reference row line and a target row line;
      a number of column lines intersecting the row lines and including a target column line, a memristor located at a number of the intersections of a row line and a column line; and
   a memory controller, wherein the memory controller includes:
      a combined reference-sneak engine to determine a combined reference-sneak current based on a reference voltage applied at the reference row line, a sense voltage applied at the target column line, and a first voltage applied at a target row line after a non-access voltage is applied to non-target and non-reference row lines and non-target column lines of the crossbar array, the reference voltage and the first voltage different than the non-access voltage;
      a combined read-sneak engine to determine a combined read-sneak current based on an access voltage applied at the target row line, the sense voltage applied at the target column line, and a second voltage applied at the reference row line after the non-access voltage is applied to the non-target and non-reference row lines and the non-target column lines of the crossbar array, the read voltage and the second voltage different than the non-access voltage, wherein the second voltage applied to the reference row line is the sense voltage and wherein determining the combined read-sneak current comprises:
         applying the read voltage to the target row line of the crossbar array,
         applying the sense voltage to the target column line,
         applying the second voltage to the reference row line, and
         collecting the combined read-sneak current along the target column line; and
      a resistance state engine to determine the resistance state of the memristor based on a difference between the combined reference-sneak current and the combined read-sneak current.

8. The system of claim 7, wherein the memory controller comprises a store engine to store the combined reference-sneak current.

9. The system of claim 7, wherein the memory controller comprises a subtraction engine to subtract the combined reference-sneak current from the combined read-sneak current.

10. The system of claim 7, wherein:
    the reference voltage is applied to the reference row line; and
    the reference row line includes memristors and selectors of a same type as remaining row lines of the crossbar array.

11. The system of claim 7, wherein:
    the crossbar array comprises at least two reference rows including the reference row line;
    a first number of memristors in a first reference row are set to their low resistance state and a second number of memristors in the first reference row are set to their high resistance state;
    a first number of memristors in a second reference row are set to their high resistance state and a second number of memristors in the second reference row are set to their low resistance state; and
    each of the first number of memristors in the first reference row shares a column with one of the first number of memristors in the second reference row.

12. A non-transitory machine-readable storage medium encoded with instructions executable by a processor, the machine-readable storage medium comprising:
    instructions to determine a combined reference-sneak current by:
        applying a reference voltage to a reference row line of a crossbar array;
        applying a sense voltage to a target column line of the crossbar away;
        applying a first voltage to a target row line of the crossbar array;
        including applying a non-access voltage to non-target and non-reference row lines and non-target column lines of the crossbar array, the reference voltage and the first voltage different than the non-access voltage; and
        collecting the combined reference-sneak current;
    instructions to determine a combined read-sneak current by:
        applying a read voltage to a target row line of the crossbar array;
        applying the sense voltage to the target column line;
        applying a second voltage to a reference row line of the crossbar array,
    wherein the second voltage applied to the reference row line is the sense voltage; and
        collecting the combined read-sneak current;
        applying the non-access voltage to the non-target and non-reference row lines and the non-target column lines of the crossbar array, the read voltage and the second voltage different than the non-access voltage; and
    instructions to determine a resistance state of a target memristor based on the combined reference-sneak current and the combined read-sneak current.

13. The machine-readable storage medium of claim 12, wherein the reference voltage is half of the value of the read voltage.

\* \* \* \* \*